(12) United States Patent
Bergman

(10) Patent No.: US 9,936,581 B1
(45) Date of Patent: Apr. 3, 2018

(54) MECHANICAL AND ELECTRICAL INTERCONNECTS BETWEEN CONDUCTIVE THREADS IN FABRICS TO PCB, FPC, AND RIGID-FLEX CIRCUITS

(71) Applicant: Flex Ltd., Singapore (SG)

(72) Inventor: Mark Bergman, Redwood City, CA (US)

(73) Assignee: Flex Ltd., Singapore (SG)

( * ) Notice: Subject to any disclaimer, the term of this patent is extended or adjusted under 35 U.S.C. 154(b) by 0 days.

(21) Appl. No.: 15/729,482

(22) Filed: Oct. 10, 2017

Related U.S. Application Data

(60) Provisional application No. 62/406,516, filed on Oct. 11, 2016.

(51) Int. Cl.
| | | |
|---|---|---|
| *H05K 1/14* | (2006.01) | |
| *H05K 3/46* | (2006.01) | |
| *H05K 1/11* | (2006.01) | |
| *H05K 1/02* | (2006.01) | |
| *H05K 3/10* | (2006.01) | |
| *H05K 3/22* | (2006.01) | |
| *H05K 1/03* | (2006.01) | |

(52) U.S. Cl.
CPC .............. *H05K 1/144* (2013.01); *H05K 1/028* (2013.01); *H05K 1/038* (2013.01); *H05K 1/118* (2013.01); *H05K 3/103* (2013.01); *H05K 3/22* (2013.01); *H05K 3/4635* (2013.01)

(58) Field of Classification Search
CPC .......... H05K 1/14; H05K 1/144; H05K 3/323; H05K 3/4635
See application file for complete search history.

(56) References Cited

U.S. PATENT DOCUMENTS

| | | | |
|---|---|---|---|
| 2005/0110406 A1* | 5/2005 | Jeong | .................... H01R 12/62 |
| | | | 313/582 |
| 2013/0270528 A1* | 10/2013 | Lee | ........................ H01L 51/52 |
| | | | 257/40 |

* cited by examiner

*Primary Examiner* — Jeremy C Norris
(74) *Attorney, Agent, or Firm* — Haverstock & Owens LLP

(57) ABSTRACT

An electrically interconnected assembly is a technology enabler for mechanical and electrical interconnects between conductive threads, such as those within fabrics and textiles, to electrical connection points, such as contact pads on a printed circuit board (PCB), a flexible printed circuit (FPC), and/or rigid-flexible circuit board. The electrically interconnected assembly uses an anisotropic conductive coated fabric to make an electrical and mechanical interconnect in fabrics or textiles. All fabrics or textiles can be anisotropic conductive coated and cut into sheet form or supplied in roll form.

14 Claims, 3 Drawing Sheets

MECHANICAL AND ELECTRICAL INTERCONNECTS BETWEEN CONDUCTIVE THREADS IN FABRICS TO PCB, FPC, AND RIGID-FLEX CIRCUITS

RELATED APPLICATIONS

This Patent Application claims priority under 35 U.S.C. 119(e) of the U.S. Provisional Patent Application, Application No. 62/406,516, filed on Oct. 11, 2016, and entitled "Mechanical and Electrical Interconnects Between Conductive Threads In Fabrics to PCB, FPC, and Rigid-Flex Circuits," which is hereby incorporated by reference in its entirety.

FIELD OF THE INVENTION

The present invention is generally directed to conductive interconnects. More specifically, the present invention is directed to conductive interconnects between a conductive thread or fiber and a flexible printed circuit board.

BACKGROUND OF THE INVENTION

Electronic devices are increasingly being developed that are able to bend, flex and twist, such as in wearable electronics. These mechanical requirements present reliability challenges on mechanical components, circuit boards and interconnects, as well as electronic components. In order to limit the stress and strain to these components while still maintaining flexibility, mechanical provisions must be put in place.

Flexible printed circuit boards provide circuit board structures that are less rigid than earlier generation printed circuit boards, and enable varying degrees of flexing, bending and twisting. Flexible interconnects between conductive wires and flexible printed circuit boards are needed for applications where durability and flexibility are a concern.

In conventional structures, an interconnection is made between the conductive wire and the flexible printed circuit board by first forming a contact pad on a top, outer surface of the flexible printed circuit board and then attaching an end of the conductive wire to the contact pad, typically using solder or conductive adhesive. This forms a rigid interconnect between the contact pad and the conductive wire. However, rigid interconnections are susceptible to breaking when subject to physical stress, especially in those applications more prone to bending, flexing and twisting of the flexible printed circuit board.

SUMMARY OF THE INVENTION

An electrically interconnected assembly is a technology enabler for mechanical and electrical interconnects between conductive threads, such as those within fabrics and textiles, to electrical connection points, such as contact pads on a printed circuit board (PCB), a flexible printed circuit (FPC), and/or rigid-flexible circuit board. The electrically interconnected assembly uses an anisotropic conductive coated fabric to make an electrical and mechanical interconnect in fabrics or textiles. All fabrics or textiles can be anisotropic conductive coated and cut into sheet form or supplied in roll form.

In an aspect, an electrically interconnected assembly is disclosed. The electrically interconnected assembly comprises an electronic device, a first anisotropic conductive film, one or more electrically conductive threads, a second anisotropic conductive film, and a fabric. The electronic device has a first surface and one or more electrical connection points on the first surface. The first anisotropic conductive film has a first surface and a second surface opposing the first surface, wherein the first anisotropic conductive film is conductive along a z-axis that is perpendicular to the first surface and the second surface, further wherein the second surface of the first anisotropic film is coupled to the first surface of the electronic device. At least a first portion of each electrically conductive thread is coupled to the first surface of the first anisotropic conductive film, and a second portion of the first portion of each electrically conductive thread is aligned with a corresponding one of the electrical connection points to form an electrical interconnection between the second portion of each electrically conductive thread and the corresponding one electrical connection point. The second anisotropic conductive film has a first surface and a second surface opposing the first surface, wherein the second surface of the second anisotropic is coupled to the first surface of the first anisotropic conductive film with the first portion of each electrically conductive thread sandwiched in between the first anisotropic conductive film and the second anisotropic conductive film. The fabric is coupled to the first surface of the second anisotropic conductive film. In some embodiments, the one or more electrically conductive threads are physically separated from each other. In some embodiments, the first anisotropic conductive film and the second anisotropic conducting film are non-conducting along a longitudinal plane perpendicular to the z-axis. In some embodiments, the first anisotropic conductive film comprises a plurality of electrically conductive particles intermixed within an adhesive. In some embodiments, each electrical connection point comprises a contact pad or solder bump. In some embodiments, the electronic device comprises a circuit board. In some embodiments, the circuit board comprises one of a flexible circuit board, a rigid printed circuit board, or a rigid-flexible printed circuit board. In some embodiments, each electrically conductive thread is one of a metal wire, a thread with an electrically conductive plating finish, an electrically conductive polymer or an electrically conductive fiber. In some embodiments, the first anisotropic conductive film and the anisotropic conductive film are compressed along the z-axis and non-compressed along an x-y plane.

In another aspect, a method of fabricating an electrically interconnected assembly is disclosed. The method includes attaching a first surface of a first anisotropic conductive film to a first surface of an electronic device, wherein the first surface of the electronic device includes one or more electrical connection points. The method also includes attaching at least a first portion of each of one or more electrically conductive threads to a second surface of the first anisotropic conductive film, and a second portion of the first portion of each electrically conductive thread is aligned with a corresponding one of the electrical connection points. The attached electronic device, first anisotropic conductive film, and one or more electrically conductive threads form a sub-assembly. The method also includes attaching a first surface of a second anisotropic conductive film to a fabric to form a cap structure, and stacking the cap structure onto the sub-assembly such that a second surface of the second anisotropic conductive film is positioned on the first portions of the one or more conductive threads. The method also includes applying heat and pressure to the stacked cap structure and sub-assembly to form an electrical interconnection between the second portion of each electrically conductive thread and the corresponding one electrical connection point via the first and second anisotropic conductive films. In some embodiments, applying pressure comprises compressing the first anisotropic conductive film along a z-axis that is perpendicular to the first surface and the second surface of the first anisotropic conductive film, and compressing the second anisotropic conductive film along the z-axis that is perpendicular to a second surface of the second anisotropic conductive film that opposes the first surface of the second anisotropic conductive film. In this case, the first anisotropic conductive film and the second anisotropic conductive film become conducting along the z-axis due to the applied pressure along the z-axis. In this case, the first anisotropic conductive film and the second anisotropic conducting film are non-conducting along a longitudinal plane perpendicular to the z-axis. In some embodiments, the one or more electrically conductive threads are physically separated from each other.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Figure 1:
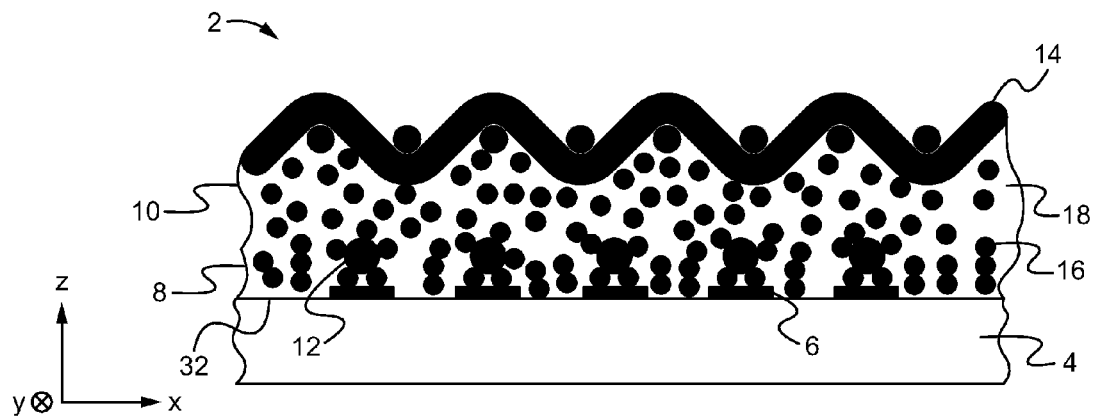
FIG. 1 illustrates a cut out side view of an electrically interconnected assembly according to some embodiments.

Embodiments of the present application are directed to a electrically interconnected assembly. Those of ordinary skill in the art will realize that the following detailed description of a electrically interconnected assembly is illustrative only and is not intended to be in any way limiting. Other embodiments of a electrically interconnected assembly will readily suggest themselves to such skilled persons having the benefit of this disclosure.

Reference will now be made in detail to implementations of the electrically interconnected assembly as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, fabrics and textiles are collectively referred to as fabrics. As also used herein, the term "fabric" generally applies to cloth or other similar materials made of threads, fibers, filaments or the like. Materials used for fabric threads can include, but are not limited to, cotton, wool, nylon, polyester or other synthetic materials. Electrically conductive threads, or simply "conductive threads", refer to electrically conductive metal wires, threads with an electrically conductive plating finish, electrically conductive polymers or electrically conductive fibers, or the like capable of electrical conductivity.

An anisotropic conductive layer is made of anisotropic conductive particles mixed within an adhesive material, collectively referred to as an anisotropic conductive film (ACF). The conductive particles can be nano-particles or micro-particles made of a conductive material, such as a metal or metal alloy. Examples of such conductive particles include, but are not limited to, nickle-copper particles or gold plated copper particles. The exact material of the conductive particles is application specific. The ACF is made into a planar sheet. One planar surface of the ACF sheet is covered with a removable protective carrier, such as a polyethylene terephthalate (PET) carrier or paper. The removable protective carrier can be subsequentlyremoved to expose the planar surface of the ACF. This exposed planar surface can be subsequently adhered to another substrate. In this manner the removable protective carrier is similar in functionality to the removable backing on two-sided tape. On the opposite planar surface of the ACF, a fabric is attached as a protective cover. The ACF and the fabric are integrated as a single element. The integrated ACF and fabric form a cap structure that provides both mechanical and electrical interconnection for an underlying electrical interconnect. The electrical interconnect is formed between a conductive thread and an electrical connection point on a corresponding electronic device. In some embodiments, the electrical interconnect is between a conductive thread and a circuit board having a contact pad to be connected to the conductive thread. Multiple electrical interconnects can be formed between multiple conductive threads and multiple electrical connection points, one electrical interconnect for one conductive wire and a corresponding one electrical connection point. Subsequent description is directed to a circuit board and contact pads, but it is understood that such description is generally applicable to other types of electronic devices and corresponding electrical connection points.

In some embodiments, another ACF separate from the cap structure is applied over a surface of a circuit board, including the contact pads, for example copper pads, on the surface of the circuit board. The conductive threads are positioned over the other ACF and properly aligned with the corresponding contact pads on the circuit board. The cap structure is applied over the conductive threads onto the other ACF to complete the stack-up. Pressure and heat are applied to the stack-up. Each conductive thread becomes electrically connected to its corresponding contact pad via the conductive particles in the other ACF and cap structure. The ACF in both the other ACF and the cap structure is anisotropic in that electrical conduction is enabled in the z-axis, the direction of applied pressure, where the z-axis extends perpendicularly between the PET carrier and the fabric, but limited laterally.

ACF is configured such that in an uncompressed state, the conductive particles are physically separated from each other to prevent electrical conduction from one surface to another. However, upon being compressed in a specific direction, the conductive particles are pressed together in the direction of compression, thereby forming a conductive link parallel to the direction of compression, for example the z-axis, but remaining non-conductive in the direction perpendicular to the direction of compression, for example the x-y plane. When compressed in the z-direction, the conductive particles are pressed together in the z-axis to form columns, each column electrically isolated from adjacent columns due to the original spacing of the particles in the non-compressed ACF. Spacing between adjacent electrically isolated columns can be 100 microns, or smaller. With the columns spaced so closely together, alignment of the ACF with the contact pads is insured as one or more columns will be formed over a footprint of each contact pad to provide the desired electrical interconnect. The anisotropic nature of the other ACF and cap structure provides electrical interconnectivity between one conductive thread and one corresponding contact pad without short circuiting adjacent conductive threads.

FIG. 1 illustrates a cut out side view of an electrically interconnected assembly according to some embodiments. The electrically interconnected assembly 2 includes a circuit board 4 having one or more contact pads 6 disposed on a surface 32. The circuit board 4 can be any conventional type of circuit board including, but not limited to, a printed circuit board (PCB), a flexible circuit board (FCB), or a rigid-flexible circuit board. A PCB is more rigid than a FCB or a rigid-flexible circuit board, and can generally be considered as a "rigid" circuit board, although there may be some degree of flexibility. The circuit board 4 includes a plurality of stacked layers, the layers made of one or more non-conductive layers and one or more conductive layers. The non-conductive layers can be made of rigid material or flexible material. Rigid materials can include, but are not limited to, glass-filled material, pre-preg or base material. Flexible materials can include, but are not limited to, polyimide, polyethylene teraphthalate (PET), polyethylene nitride (PEN) or polyurethane. The conductive layers are each electrically conductive layers made of a metal, such as copper, that is patterned into electrically conductive traces, or interconnects. The contact pads 6 provide electrical connection points for corresponding interconnects. For simplicity, the circuit board 4 is shown in FIG. 1 as a simple block, but is intended to represent a circuit board of the type described above.

The electrically interconnected assembly 2 also includes an ACF 8, conductive threads 12, an ACF 10, and a fabric 14. The ACF 8 is adhered to the surface 32, including contact pads 6, of the circuit board 4. The fabric 14 is adhered to the ACF 10. The electrically interconnected assembly 2 shown in FIG. 1 shows the completed assembly after heat and pressure have been applied. The ACF 8 and ACF 10 are adhered together and compressed in the z-direction with the conductive threads 10 sandwiched in between. Each of the ACF 8 and the ACF 10 includes conductive particles 16 distributed throughout an adhesive material 18.

Each conductive thread 12 is aligned with a corresponding one of the contact pads 6. In some embodiments, an end of the conductive thread 12 is aligned with the corresponding contact pad 6. In other embodiments, a portion of the conductive thread 12 other than an end is aligned with the corresponding contact pad 6. When compressed, the conductive particles 16 in the ACF 8 are compressed together along the z-axis, forming columns of conductive particles 16 that are in contact with each other. These columns form electrically conductive interconnects. Due to the original density and distribution of the conductive particles within the ACF 8, the columns are closely positioned in the x and y-directions, but do not contact each other and therefore remain electrically isolated from each other. The density of the columns is such that at least one or more columns is aligned with each conductive thread 12 and corresponding contact pad 6. The aligned one or more columns provides an electrical interconnect between the conductive thread 12 and corresponding contact pad 6. The conductive particles 16 in the ACF 10 are also compressed together along the z-axis due to the applied compression. Conductive particles 16 aligned in the z-direction with each conductive thread 12 are pushed toward, and with some particles, pushed against the conductive threads 12 in an opposite direction as the conductive particles 16 in the ACF 8. The use of both ACF 8 and ACF 10 acts to envelop, or encase, the perimeter of each conductive thread 12 with conductive particles 16 to create a more robust electrical connection. The use of both ACF 8 and ACF 10 more securely maintains each conductive thread 12 in position relative to its corresponding contact pad 6, and also serves as a mechanical stress relief for the connection of the conductive thread 16 to the ACF 8 and underlying contact pad 6 when incorporated onto the fabric 14.

Figure 2:
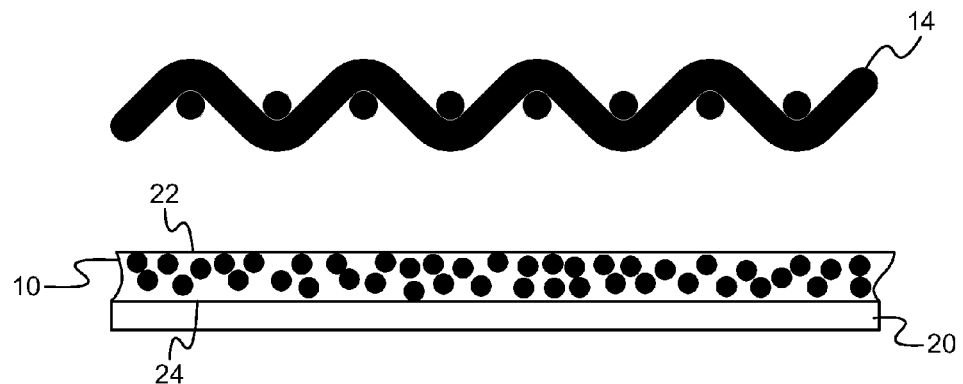
FIGS. 2-7 illustrate a method of fabricating an electrically interconnected assembly according to some embodiments.

FIGS. 2-7 illustrate a method of fabricating an electrically interconnected assembly according to some embodiments. The method shown in FIGS. 2-7 is described in relation to the electrically interconnected assembly of FIG. 1. It is understood that the same methodology can be applied to fabricate similar electrically interconnected assemblies or that similar methodologies can be used to fabricate the same or similar electrically interconnected assembly as that shown in FIG. 1. FIG. 2 illustrates the constituent components of a cap structure prior to assembly. In some embodiments, the fabric 14 and the ACF 10 are sized to match a footprint of the circuit board 4 or other electrical component to which they are to be applied as a cap structure. In other embodiments, a footprint of the fabric 14 and a footprint of the ACF 10 are larger than a footprint of the circuit board 4. For example, 0.25 to 0.5 inch portion of oversized fabric and ACF can extend beyond the footprint of the circuit board. The portion of the fabric that extends beyond the footprint of the circuit board can be used as attachment area to another substrate, such as another piece of fabric positioned on the opposite side of the circuit board so as to sandwich the circuit board between the two pieces of fabric. In some embodiments, the footprint of the ACF 10 matches the footprint of the fabric 14. In other embodiments, the footprint of the ACF 10 is smaller than a footprint of the fabric 14.

Figure 3:
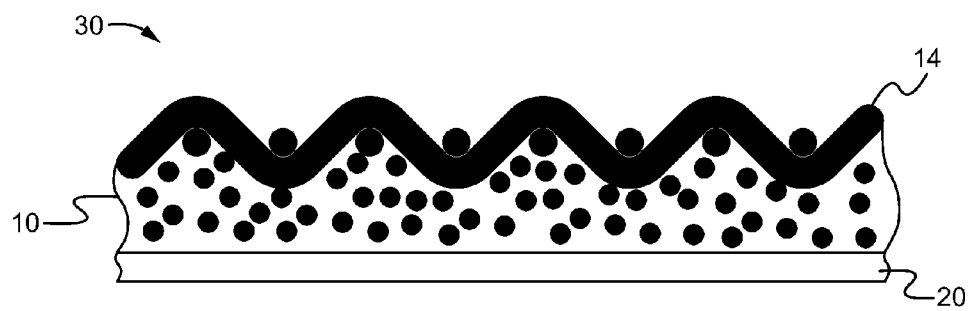
Figure 6:
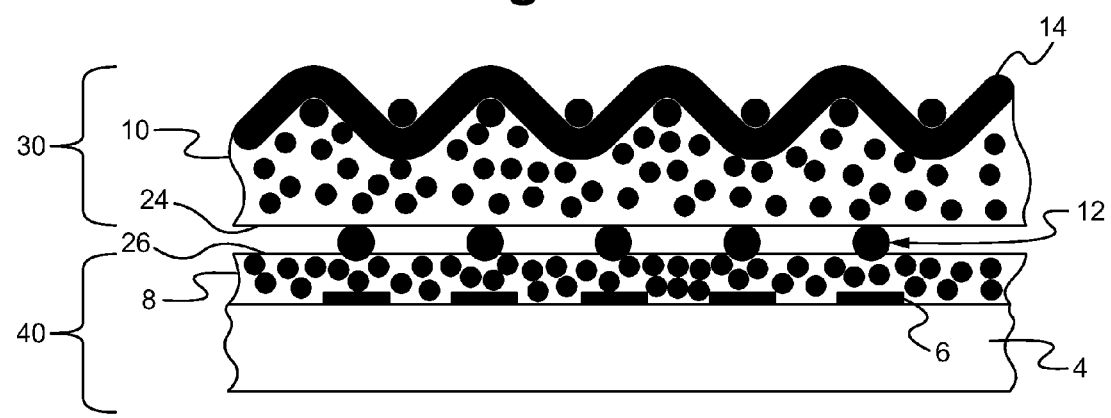

The ACF 10 is provided as a planar sheet. Planar surface 24 of the ACF 10 is covered with a removable protective carrier 20, such as a polyethylene terephthalate (PET) carrier or paper. The removable protective carrier 20 can be subsequently removed, as shown in FIG. 6, to expose the planar surface 24. This exposed planar surface can be subsequently attached to another substrate. In this manner the removable protective carrier 20 is similar in functionality to the removable backing on two-sided tape. On the opposite planar surface 22 of the ACF 10, the fabric 14 is attached to the ACF 10 as a protective cover, as shown in FIG. 3. The ACF 10 and the fabric 14 are integrated as a single element. The integrated ACF and fabric form a cap structure 30. The ACF 10 in the cap structure 30 is in a non-compressed state at this step.

Figure 4:
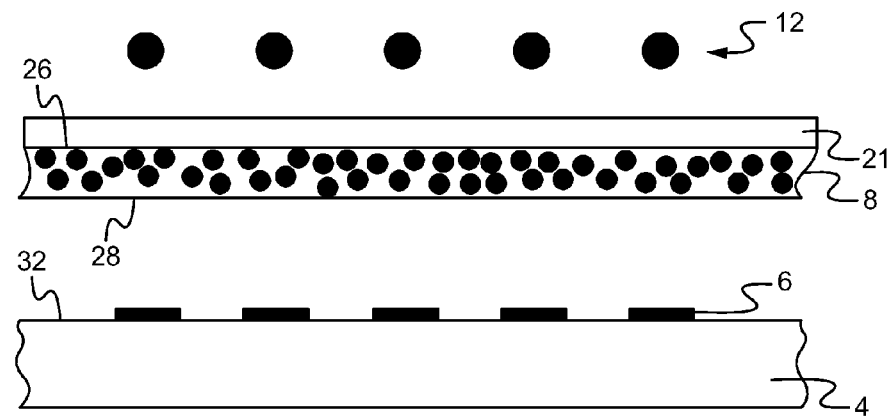

FIG. 4 illustrates the circuit board 4, the ACF 8, and the conductive threads 12 prior to assembly. The circuit board 4 includes a surface 32 on which contact pads 6 are formed. The ACF 8 has opposing surfaces 26 and 28, surface 26 is covered with a removable protective carrier 21. In some embodiments, a footprint of the ACF 8 substantially matches a footprint of the surface 32 of the circuit board 4. The thickness of the ACF 8 may or may not be the same as the thickness of the ACF 10 depending on the application. The number of contact pads 6 shown in the figures is for exemplary purposes only and can be more or less than that shown. The circuit board 4 is shown as a side-view. It is understood that an array of contact pads can be formed over any portion of the surface 32 in the x-y plane. The figures also show the number of conductive threads equaling the number of contact pads. It is understood that only select contact pads may be interconnected to conductive threads, in which case the number of conductive threads is less than the number of contact pads.

Figure 5:
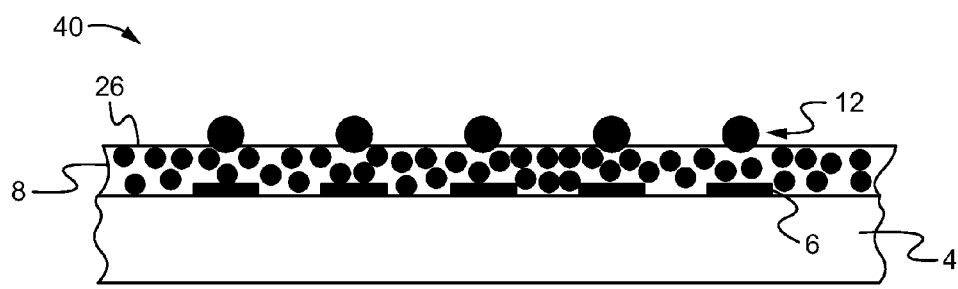

FIG. 5 illustrates the circuit board 4, the ACF 8, and the conductive threads 12 assembled in a non-compressed state. The surface 28 of the ACF 8 is applied onto the surface 32 and contact pads 6 of the circuit board 4. The carrier 21 is then removed from the surface 26 of the ACF 8. Each conductive thread 12 is then positioned on the surface 26 of the ACF 8 and vertically aligned over a corresponding one of the contact pads 6. The adhesive of the ACF 8 maintains the conductive threads 12 in position during this sub-assembly step. In some embodiments, an end of the conductive thread is aligned over the corresponding contact pad. In other embodiments, a portion other than the end of the conductive pad is aligned over the corresponding contact pad. Each of the conductive threads are shown in the figures as being aligned in parallel. It is understood that this is merely an exemplary alignment pattern and that the conductive threads can be alternatively angled relative to each other, as well as differently from each other, as long as none of the conductive threads overlap each other. The assembled circuit board 4, ACF 8, and conductive threads 12 form sub-assembly 40.

FIG. 6 illustrates the cap structure of FIG. 3 attached to the sub-assembly of FIG. 5 in a non-compressed state. To assemble the stack up shown in FIG. 6, the carrier 20 (FIG. 3) from the ACF 10 is removed and the cap structure 30 is positioned onto the sub-assembly 40 with the portions of the conductive threads 12 attached to the ACF 8 sandwiched therebetween. In some embodiments, the footprints of each of the circuit board 4, the ACF 8, the ACF 10 and the fabric 14 are the same. In other embodiments, the size and footprints of the various components can vary relative to each other. For example, the footprint of the fabric 14 can be larger than the footprint of the circuit board 4, and the footprint of the ACF 10 can be configured larger than the footprint of the ACF 8, up to the same size and corresponding footprint of the fabric 14. In this alternative configuration, the portion of the ACF 10 that extends beyond the footprint of the circuit board 4 can be used to adhere the fabric 14 to another substrate, such as a second piece of fabric on the opposite side of the circuit board 4 as the fabric 14. In this manner, the cap structure 14 functions as a patch over the circuit board 4 which can be attached to another substrate with the circuit board 4 sandwiched in between.

Figure 7:
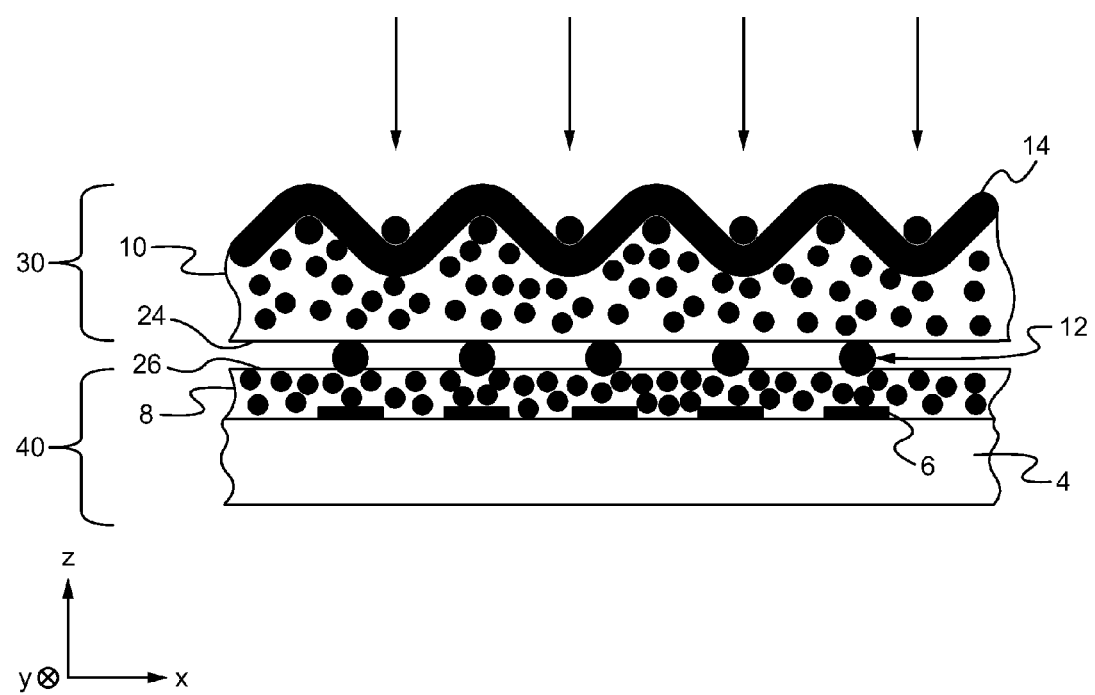

Once the stack up assembly of FIG. 6 is formed, heat and compression are applied. As shown in FIG. 7, compression is applied along the direction of the stack, the z-direction, resulting in the completed electrically interconnected assembly shown in FIG. 1. The cap structure 30 can be attached using a hot bar style attachment method and/or a hot roll method to adhere conductive threads to a PCB, FPC, or rigid-flexible circuit board. It is understood that other conventional techniques can be used to appropriately apply heat and compression. Compression in the z-direction compresses both the ACF 8 and the ACF 10 along the z-axis, but leaves the ACF 8 and the ACF 10 non-compressed in the x-y plane. Compression in the z-direction forms the electrically conductive interconnect columns of contacting conductive particles in the ACF 8 and the ACF 10. The contacting conductive particles within the ACF 8 form an electrically conductive interconnect between each conductive thread 12 and corresponding contact pad 6. The contacting conductive particles within the ACF 10 enhance the electrical connection with the conductive thread 12 and the ACF 8. In addition to enhancing the electrical connection, the ACF 10 secures the conductive thread 12 in place relative to the ACF 8 and the corresponding contact pad 6.

The conductive threads function to span out electrical interconnections beyond a footprint of the circuit board. An opposite end, or another portion of, each conductive thread can be coupled to another electronic device including, but not limited to, another circuit board, a sensor, a microphone, a speaker or a battery. Coupling to the other electrical device can be accomplished using a similar electrically interconnected assembly.

The use of ACF and an ACF coated fabric provides enhanced mechanical and electrical interconnection of the conductive threads to the contact pads. The electrically interconnected assembly eliminates soldered joints and reduces mechanical strain when attaching PCB, FPC, or rigid-flex circuits in wearable fabric and textile products. In general, this ACF enhanced structure can be used to electrically and mechanically couple a conductive thread to any type of electronic device that has an electrical connection point.

The present invention has been described in terms of specific embodiments incorporating details to facilitate the understanding of the principles of construction and operation of the electrically interconnected assembly. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. An electrically interconnected assembly comprising:
   a. an electronic device having a first surface and one or more electrical connection points on the first surface;
   b. a first anisotropic conductive film having a first surface and a second surface opposing the first surface, wherein the first anisotropic conductive film is conductive along a z-axis that is perpendicular to the first surface and the second surface, further wherein the second surface of the first anisotropic film is coupled to the first surface of the electronic device;
   c. one or more electrically conductive threads, at least a first portion of each electrically conductive thread is coupled to the first surface of the first anisotropic conductive film, and a second portion of the first portion of each electrically conductive thread is aligned with a corresponding one of the electrical connection points to form an electrical interconnection between the second portion of each electrically conductive thread and the corresponding one electrical connection point;
   d. a second anisotropic conductive film having a first surface and a second surface opposing the first surface, wherein the second surface of the second anisotropic is coupled to the first surface of the first anisotropic conductive film with the first portion of each electrically conductive thread sandwiched in between the first anisotropic conductive film and the second anisotropic conductive film; and
   e. a fabric coupled to the first surface of the second anisotropic conductive film.

2. The electrically interconnected assembly of claim 1 wherein the one or more electrically conductive threads are physically separated from each other.

3. The electrically interconnected assembly of claim 1 wherein the first anisotropic conductive film and the second anisotropic conducting film are non-conducting along a longitudinal plane perpendicular to the z-axis.

4. The electrically interconnected assembly of claim 1 wherein the first anisotropic conductive film comprises a plurality of electrically conductive particles intermixed within an adhesive.

5. The electrically interconnected assembly of claim 1 wherein each electrical connection point comprises a contact pad or solder bump.

6. The electrically interconnected assembly of claim 1 wherein the electronic device comprises a circuit board.

7. The electrically interconnected assembly of claim 6 wherein the circuit board comprises one of a flexible circuit board, a rigid printed circuit board, or a rigid-flexible printed circuit board.

8. The electrically interconnected assembly of claim 1 wherein each electrically conductive thread is one of a metal wire, a thread with an electrically conductive plating finish, an electrically conductive polymer or an electrically conductive fiber.

9. The electrically interconnected assembly of claim 1 wherein the first anisotropic conductive film and the anisotropic conductive film are compressed along the z-axis and non-compressed along an x-y plane.

10. A method of fabricating an electrically interconnected assembly, the method comprising:
   a. attaching a first surface of a first anisotropic conductive film to a first surface of an electronic device, wherein the first surface of the electronic device includes one or more electrical connection points;
   b. attaching at least a first portion of each of one or more electrically conductive threads to a second surface of the first anisotropic conductive film, and a second portion of the first portion of each electrically conductive thread is aligned with a corresponding one of the electrical connection points, wherein the attached electronic device, first anisotropic conductive film, and one or more electrically conductive threads form a sub-assembly;
   c. attaching a first surface of a second anisotropic conductive film to a fabric to form a cap structure;
   d. stacking the cap structure onto the sub-assembly such that a second surface of the second anisotropic conductive film is positioned on the first portions of the one or more conductive threads;
   e. applying heat and pressure to the stacked cap structure and sub-assembly to form an electrical interconnection between the second portion of each electrically conductive thread and the corresponding one electrical connection point via the first and second anisotropic conductive films.

11. The method of claim 10 wherein applying pressure comprises compressing the first anisotropic conductive film along a z-axis that is perpendicular to the first surface and the second surface of the first anisotropic conductive film, and compressing the second anisotropic conductive film along the z-axis that is perpendicular to a second surface of the second anisotropic conductive film that opposes the first surface of the second anisotropic conductive film.

12. The method of claim 11 wherein the first anisotropic conductive film and the second anisotropic conductive film become conducting along the z-axis due to the applied pressure along the z-axis.

13. The method of claim 12 wherein the first anisotropic conductive film and the second anisotropic conducting film are non-conducting along a longitudinal plane perpendicular to the z-axis.

14. The method of claim 10 wherein the one or more electrically conductive threads are physically separated from each other.

* * * * *